(12) United States Patent
Nakamura et al.

(10) Patent No.: US 8,080,884 B2
(45) Date of Patent: Dec. 20, 2011

(54) MOUNTING STRUCTURE AND MOUNTING METHOD

(75) Inventors: Kojiro Nakamura, Osaka (JP); Yoshihiro Tomura, Osaka (JP); Kentaro Kumazawa, Osaka (JP)

(73) Assignee: Panasonic Corporation, Osaka (JP)

( * ) Notice: Subject to any disclaimer, the term of this patent is extended or adjusted under 35 U.S.C. 154(b) by 215 days.

(21) Appl. No.: 12/486,841

(22) Filed: Jun. 18, 2009

(65) Prior Publication Data

US 2009/0321926 A1 Dec. 31, 2009

(30) Foreign Application Priority Data

Jun. 27, 2008 (JP) ................................. 2008-168011

(51) Int. Cl.
*H01L 23/52* (2006.01)
*H01L 23/48* (2006.01)
*H01L 29/40* (2006.01)
*H01L 23/485* (2006.01)
*H01L 23/498* (2006.01)

(52) U.S. Cl. ........ 257/780; 257/778; 257/781; 257/737; 257/738; 257/E23.021; 257/E23.069

(58) Field of Classification Search ................. 257/780, 257/778, 781, 737, 738, E23.021, E23.069
See application file for complete search history.

(56) References Cited

U.S. PATENT DOCUMENTS

| | | | |
|---|---|---|---|
| 4,878,611 A * | 11/1989 | LoVasco et al. | 228/180.22 |
| 5,956,606 A | 9/1999 | Burnette | 438/615 |
| 6,005,292 A * | 12/1999 | Roldan et al. | 257/777 |
| 6,093,964 A | 7/2000 | Saitoh | 257/738 |
| 6,310,403 B1 * | 10/2001 | Zhang et al. | 257/786 |
| 6,372,622 B1 | 4/2002 | Tan et al. | 438/612 |
| 6,455,785 B1 | 9/2002 | Sakurai et al. | 174/260 |
| 6,569,708 B2 | 5/2003 | Kawashima | 438/108 |
| 6,974,330 B2 * | 12/2005 | Caldwell et al. | 439/66 |
| 7,101,781 B2 * | 9/2006 | Ho et al. | 438/612 |
| 2001/0044198 A1 | 11/2001 | Kawashima | 438/613 |
| 2002/0140094 A1 | 10/2002 | Kubota et al. | 257/737 |
| 2002/0151164 A1 | 10/2002 | Jiang et al. | 438/613 |

FOREIGN PATENT DOCUMENTS

| | | |
|---|---|---|
| JP | 09-069539 | 3/1997 |
| JP | 11-163019 | 6/1999 |
| JP | 2000-124248 | 4/2000 |
| JP | 2000-228417 | 8/2000 |
| JP | 2001-257229 | 9/2001 |
| JP | 2003-197665 | 7/2003 |
| JP | 2003-258014 | 9/2003 |
| JP | 2004-047622 | 2/2004 |

* cited by examiner

*Primary Examiner* — Luan C Thai
(74) *Attorney, Agent, or Firm* — Steptoe & Johnson LLP

(57) ABSTRACT

A mounting structure of the present invention includes a semiconductor element 101, a circuit board 301 having electrodes 302 opposed to electrodes 102 of the semiconductor element 101, and conductive two-layer bumps 213. Second bumps 210 joined to the electrodes 302 of the circuit board 301 are formed larger than first bumps 209 joined to the electrodes 102 of the semiconductor element 101. The axis of the first bump 209 and the axis of the second bump 210 are not aligned with each other.

8 Claims, 17 Drawing Sheets

MOUNTING STRUCTURE AND MOUNTING METHOD

FIELD OF THE INVENTION

The present invention relates to a mounting structure and a mounting method for mounting a semiconductor element on a circuit board such as a printed circuit board, and particularly relates to a bump structure provided on an electrode of a semiconductor element and a method of forming the same.

BACKGROUND OF THE INVENTION

FIG. 17 shows a bump forming method of the prior art (for example, see Matsushita Technical Journal, Vol. 47, No. 3, Jun. 2001, issued by Panasonic Corporation). The bump forming method uses a wire bonding technique. As shown in FIG. 17A, an Au ball 202 is formed by spark discharge on the end of an Au wire 201 passed through a capillary 203. As shown in FIG. 17B, the Au ball 202 is brought into contact with an electrode 102 of a semiconductor element 101 heated by a heating stage (not shown) and is joined to the electrode 102 by applying a pressure and an ultrasonic wave. As shown in FIG. 17C, the Au wire 201 is pulled off by lifting the capillary 203 while drawing the Au wire 201 by a fixed amount, so that a stud bump 208 is formed.

FIGS. 18A and 18B show the overall configuration of a flip-chip mounting structure and a sectional view of a connected portion of the flip-chip mounting structure according to Japanese Patent No. 3150347. The stud bump 208 formed in the foregoing manner on the electrode 102 of the semiconductor element 101 is connected to an electrode 302 of a printed circuit board 301.

FIGS. 19A to 19F and FIGS. 20A to 20C show a bump forming method described in Japanese Patent Laid-Open No. 8-264540. The bump forming method also uses a wire bonding technique. As shown in FIG. 19A, a metal ball 205 is formed on the end of a wire 204 passed through a capillary 203. As shown in FIG. 19B, the metal ball 205 is joined to an electrode 102 of a semiconductor element 101 by applying an ultrasonic wave while pressing the metal ball 205 to the electrode 102 with the end of the capillary 203. As shown in FIGS. 19C and 19D, the end of the capillary 203 is laterally moved and then an ultrasonic wave is applied while a pressure is applied to the joint of the metal ball 205, so that the wire 204 is cut off as shown in FIG. 19(E). Thus a first bump 206 is formed.

After that, another metal ball 205 is similarly formed and is joined onto the first bump 206 as shown in FIG. 19F. As shown in FIGS. 20A and 20B, the end of the capillary 203 is laterally moved and then an ultrasonic wave is applied while a pressure is applied to the joint of the metal ball 205, so that the wire 204 is cut off. Thus a second bump 207 is formed and a two-layer bump 218 is completed.

In the two-layer bump 218, the first bump 206 and the second bump 207 are substantially identical in shape or the second bump 207 is smaller than the first bump 206. FIG. 21 shows a sectional view of a connected portion of a flip-chip mounting structure using the two-layer bump 218.

The stud bump 208 and the two-layer bump 218 are both formed on the electrode 102 of the semiconductor element 101. Thus the diameters of the bumps have decreased as the electrodes 102 have been reduced in size with higher densities. As the diameters of the bumps decrease, a contact area between the circuit board electrode 302 and one of the stud bump 208 and the two-layer bump 218 decreases in flip-chip mounting, reducing the reliability of connection.

DISCLOSURE OF THE INVENTION

The present invention has been devised in view of the foregoing problem. An object of the present invention is to provide a mounting structure and a mounting method which can obtain a sufficient contact area on a circuit board electrode and thus secure the reliability of connection even when a semiconductor element has small electrodes.

In order to attain the object, a mounting structure of the present invention includes a semiconductor element, a circuit board having electrodes opposed to the electrodes of the semiconductor element, and conductive two-layer bumps each of which is made up of a first bump joined to the electrode of the semiconductor element and a second bump joined to the electrode of the circuit board, wherein the second bump is larger than the first bump, and the axis of the first bump and the axis of the second bump are not aligned with each other.

Since the second bump is larger in the two-layer bump, even the semiconductor element having small electrodes can obtain a sufficient contact area between the bump and the circuit board electrode, achieving the reliability of connection. Further, since the axis of the first bump and the axis of the second bump are not aligned with each other, it is possible to reduce a thermal stress generated in a thermal shock test and so on.

The electrode of the circuit board is larger than the electrode of the semiconductor element, the second bump is not larger than the electrode of the circuit board, and the first bump is not larger than the electrode of the semiconductor element.

A virtual line passing through the center of gravity of the second bump passes through the first bump. The first bump has a diameter not smaller than a half of the diameter of the second bump. The semiconductor element has an elastic body formed along the side of the first bump, and the second bump is placed on the first bump and the elastic body.

The first bump is displaced to one end of the electrode of the semiconductor element. The second bump is displaced closer to the end of the electrode of the semiconductor element than the first bump.

A mounting method of the present invention includes the steps of: forming a first metal ball on the end of a wire passed through a capillary; forming a first bump by applying an ultrasonic wave while pressing the first metal ball onto the electrode of a semiconductor element with the capillary; forming a second metal ball on the end of the wire passed through the capillary, the second metal ball being larger than the first metal ball; forming a second bump by applying an ultrasonic wave while pressing the second metal ball onto the first bump with the capillary so as not to align the axes of the first bump and the second bump; and connecting the semiconductor element to the electrodes of a circuit board at the second bumps, the semiconductor element having two-layer bumps formed thereon, the two-layer bump being made up of the first bump and the second bump.

The capillary for forming the first metal ball is different from the capillary for forming the second metal ball. The wire for forming the first metal ball is different from the wire for forming the second metal ball.

According to the mounting structure and the mounting method of the present invention, even the semiconductor element having small electrodes can obtain a sufficient contact area between the bump and the circuit board electrode, thereby achieving the reliability of connection with high quality.

BRIEF DESCRIPTION OF THE DRAWINGS

FIG. 12 is a sectional view showing still another example of the electrode of the semiconductor element;

DESCRIPTION OF THE EMBODIMENT

An embodiment of the present invention will be described below in accordance with the accompanying drawings.

Figure 1:
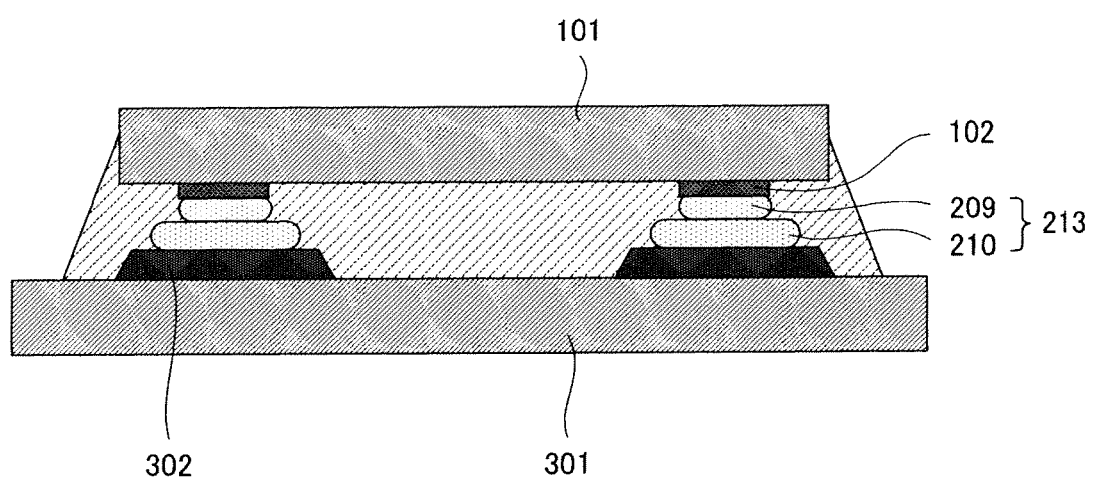
FIG. 1 is a sectional view showing a mounting structure according to an embodiment of the present invention.

As shown in FIG. 1, a mounting structure of the present invention has a semiconductor element 101, a circuit board 301 having electrodes 302 opposed to electrodes 102 of the semiconductor element 101, and conductive two-layer bumps 213 which join the electrodes 102 of the semiconductor element 101 and the electrodes 302 of the circuit board 301.

In the two-layer bump 213, a second bump 210 joined to the electrode 302 of the circuit board 301 is larger than a first bump 209 joined to the electrode 102 of the semiconductor element 101.

Figure 2A:
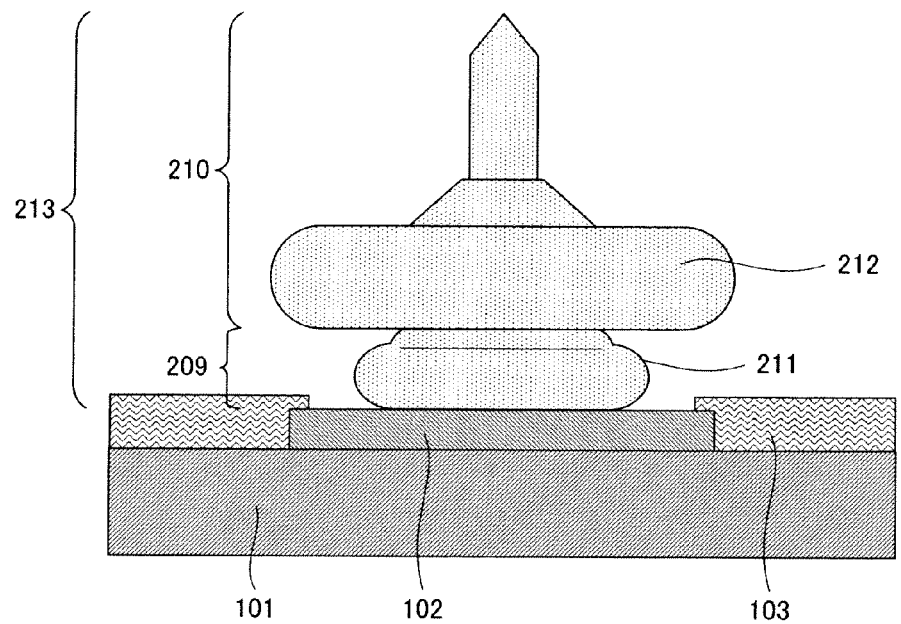
FIGS. 2A and 2B are sectional views showing an electrode of a semiconductor element composing the mounting structure of FIG. 1.
Figure 2B:
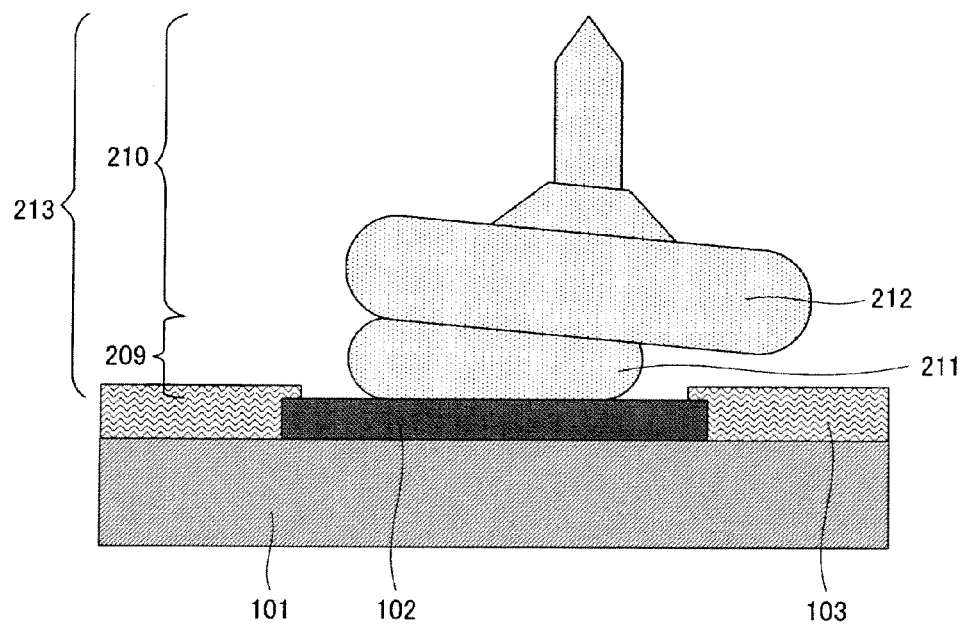

FIGS. 2A and 2B show the electrode of the semiconductor element 101 used in the mounting structure of FIG. 1, from two different directions forming an angle of 90° relative to each other. The first bump 209 is substantially shaped like a disk and is formed at the center of the electrode surface of the electrode 102. The second bump 210 is formed on the first bump 209 as a convex portion and has a disk-like base 212 larger in diameter than the first bump 209. In this case, the diameter is the maximum diameter of the electrode 102. The axis of the first bump 209 and the axis of the second bump 210 are not aligned with each other. A virtual line (substantially aligned with the axis of the second bump 210) passing through the center of gravity of the second bump 210 passes through the first bump.

For example, when the electrode 102 has an outside dimension of 54 μm and an array pitch of 120 μm, the first bump 209 is 45 μm in diameter and 10 μm in height and the base 212 of the second bump 210 is 85 μm in diameter and 25 μm in height. In this case, a displacement between the axis of the first bump 209 and the axis of the second bump 210 is, for example, 20 μm. These dimensions can be adjusted by about±3 μm to 10 μm according to the material of the bumps, the bump forming conditions, and the bonding conditions.

Generally, the electrode 102 is made of an Al compound which is mainly composed of Al and contains Si and Cu. The first bump 209 and the second bump 210 are made of Au (a purity of at least 99%). On the surface of the semiconductor element 101, a protective film 103 is formed on an area other than the electrodes 102. For the protective film 103, photosensitive or non-photosensitive polyimide and insulating and heat resistant materials such as polybenzoxazole (PBO) are generally used.

Figure 3A:
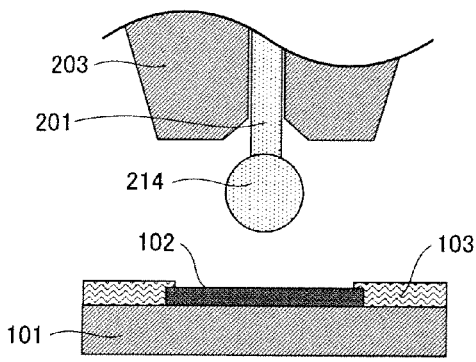
FIGS. 3A to 3F are sectional views showing the steps of forming a two-layer bump in the semiconductor element of FIGS. 2A and 2B.
Figure 3B:
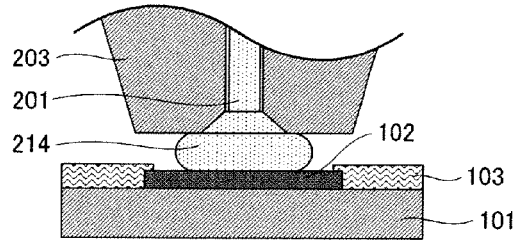
Figure 3C:
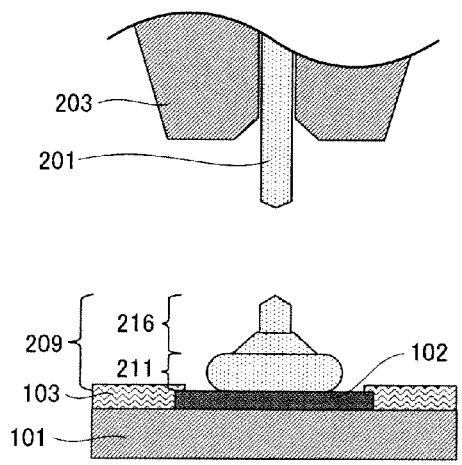

Referring to FIGS. 3A to 3F, the following will discuss the two-layer bump 213 formed with the foregoing dimensions. As shown in FIG. 3A, an Au wire 201 having a diameter of 23 μm is passed through a capillary 203 having a bore dimension of 28 μm on the end, and a first Au ball 214 having a diameter of 38 μm is formed on the end of the Au wire 201. As shown in FIG. 3B, the capillary 203 is aligned with the electrode 102 of the semiconductor element 101 heated to 170° C. to 300° C. on a heating stage (not shown), and the first Au ball 214 is pressed onto the electrode 102 with a load of 30 gf to 80 gf by the end of the capillary 203 and an ultrasonic wave is applied to the first Au ball 214, so that the first Au ball 214 is plastically deformed and is joined to the electrode 102. As shown in FIG. 3C, the capillary 203 is lifted while the Au wire 201 of 300 μm to 500 μm is drawn, and then the Au wire 201 is pulled off. Thus the first bump 209 having a base 211 and a protrusion 216 is formed.

Figure 3D:
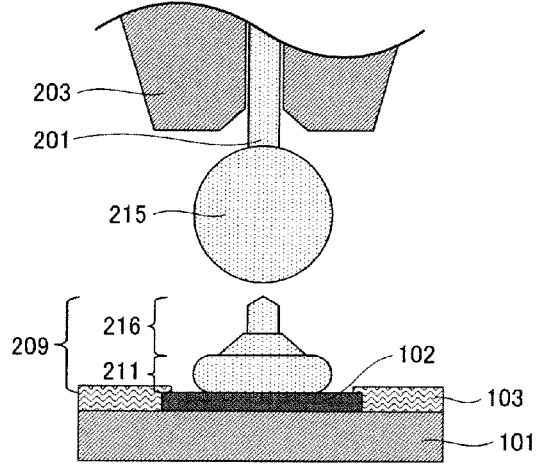

Next, as shown in FIG. 3D, a second Au ball 215 having a diameter of 60 μm is formed on the end of the capillary 203. At this point, the second Au ball 215 is formed with a different spark current and a different spark time from the formation of the first Au ball 214, so that the second Au ball 215 larger than the first Au ball 214 is formed.

Figure 3E:
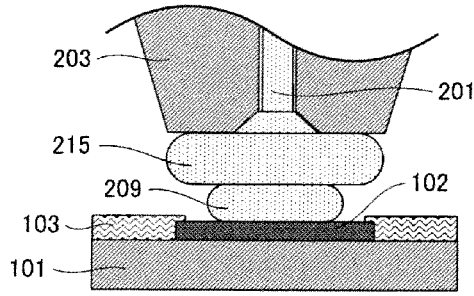
Figure 3F:
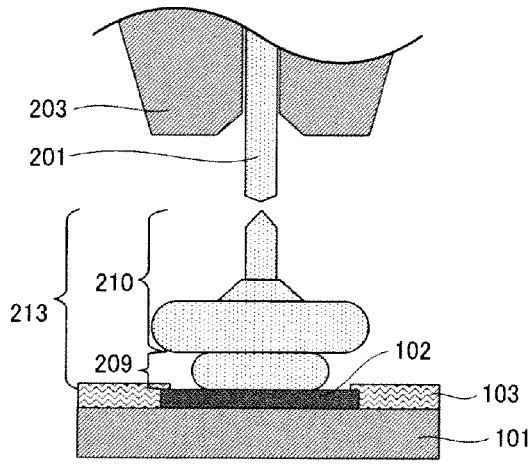

After that, as shown in FIG. 3E, the second Au ball 215 is joined onto the first bump 209, and the Au wire 201 is pulled off as shown in FIG. 3F, so that the second bump 210 is formed. Thus the two-layer bump 213 is completed.

In the formed two-layer bump 213, the first bump 209 is shaped like a disk substantially equivalent to the base 211 and the second bump 210 is a convex portion having a base 112 larger in diameter than the first bump 209.

In this configuration, the first bump 209 and the second bump 210 are formed using the same Au wire 201 and the same capillary 203. The first bump 209 and the second bump 210 may be formed using Au wires 201 and capillaries 203 having different diameters. Further, in order to achieve high heat dissipation with low cost, the second bump 210 may be formed using a metal wire made of a Cu compound which is mainly composed of Cu and contains Pd.

Figure 4A:
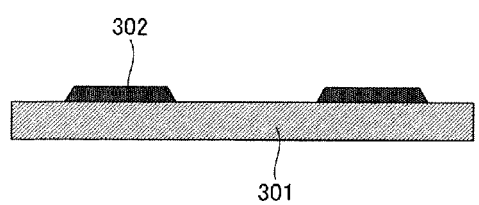
FIGS. 4A to 4E are sectional views showing the steps of flip-chip mounting the semiconductor element of FIGS. 2A and 2B.
Figure 4B:
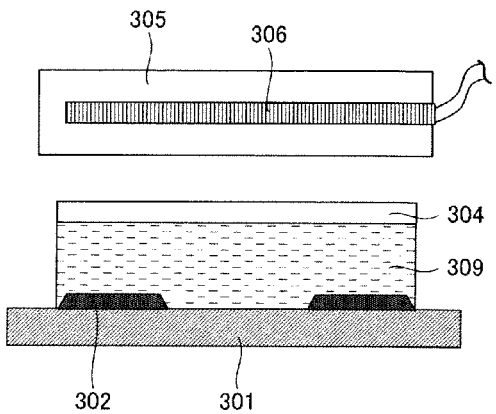

Referring to FIGS. 4A to 4E, the following will describe a flip-chip mounting method of the semiconductor element 101. On the circuit board 301 shown in FIG. 4A, a thermosetting resin sheet 309 is placed as shown in FIG. 4B and is bonded with a pressure of about 5 kgf/cm$^2$ to 10 kgf/cm$^2$ by a bonding tool 305 which is heated to 70° C. to 120° C. by a built-in heater 306. Reference numeral 304 denotes a separator releasably disposed on the thermosetting resin sheet 309 to prevent bonding of the bonding tool 305 and so on.

The thermosetting resin sheet 309 is made of an insulating material containing an inorganic filler such as silica or containing no inorganic filler (for example, a material such as epoxy resin, phenol resin, and polyimide). The material preferably has high heat resistance to high temperatures (for example, heat resistance to 260° C. for 10 seconds) in a reflow process to be performed later. The material is used after being cut to dimensions larger than the dimensions of the semiconductor element 101 by about 1 mm. After the thermosetting resin sheet 309 is bonded, the separator 304 is peeled off from the thermosetting resin sheet 309.

Figure 4C:
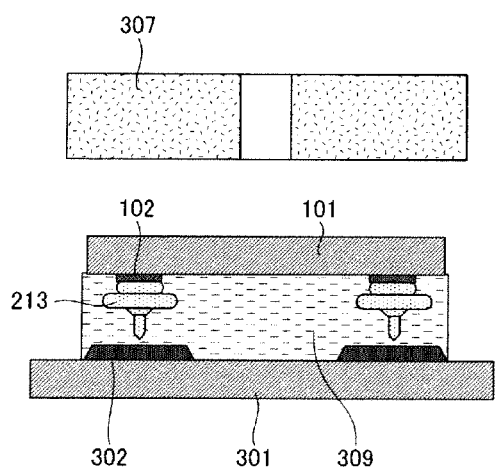
Figure 4D:
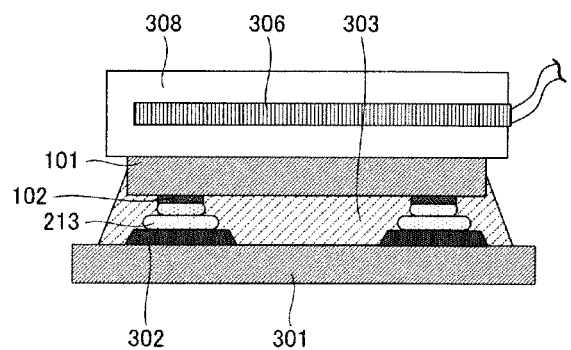

Next, as shown in FIG. 4(C), the semiconductor element 101 on which the two-layer bumps 213 have been formed is aligned with the circuit board 301 on which the thermosetting resin sheet 309 has been bonded, by using a suction tool 307. The semiconductor element 101 is aligned such that the two-layer bumps 213 correspond to the circuit board electrodes 302. After that, the semiconductor element 101 is pressed and mounted on the thermosetting resin sheet 309. The temperature of the suction tool 307 is set substantially at the temperature of the ambient environment and not higher than a temperature at which the heat curing of the thermosetting resin sheet 309 is started. After that, as shown in FIG. 4D, the semiconductor element 101 is pressed and heated by a crimping tool 308 heated by the heater 306 and is electrically connected to the circuit board 301 via the two-layer bumps 213.

Figure 4E:
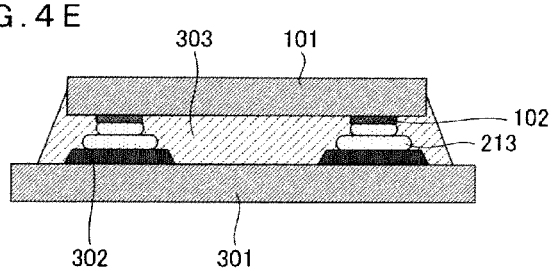

At this point, the two-layer bumps 213 are pressed onto the circuit board electrodes 302 of the circuit board 301 and are joined to the circuit board electrodes 302 while being deformed. Thus the crimping tool 308 has to apply a pressure of at least 20 gf. Further, a load applied by the crimping tool 308 causes no damage to the semiconductor element 101, the two-layer bumps 213, and the circuit board 301. The thermosetting resin sheet 309 is thermally cured by applying heat of about 170° C. to 250° C. through the semiconductor element 101 by the crimping tool 308 for about several to 30 seconds, and the semiconductor element 101 is fixed on the circuit board 301 with a cured thermosetting resin 303. Thus a mounting structure of FIG. 4E is obtained.

Figure 5A:
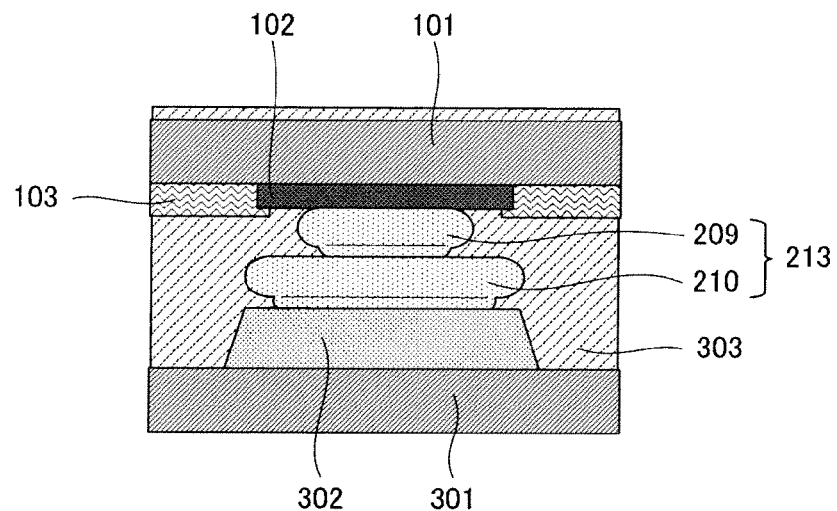
FIGS. 5A and 5B are enlarged views showing the joint of the semiconductor element and a circuit board electrode in the mounting structure of FIG. 1.
Figure 5B:
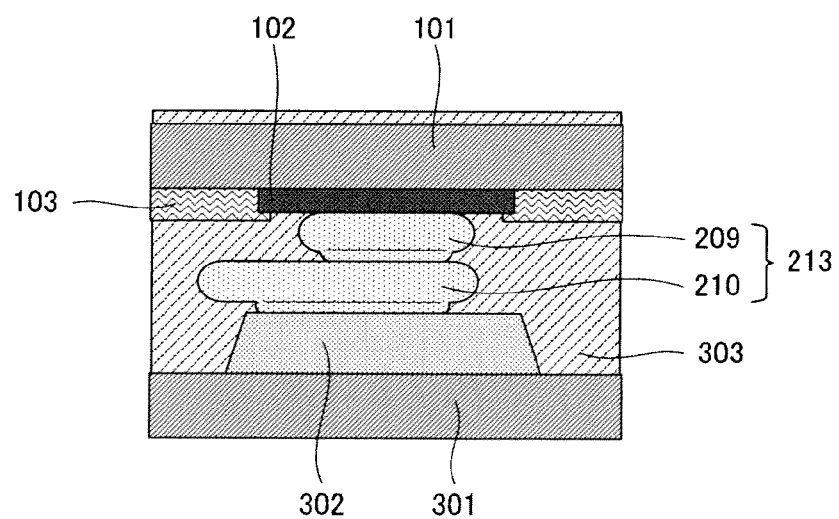
Figure 17A:
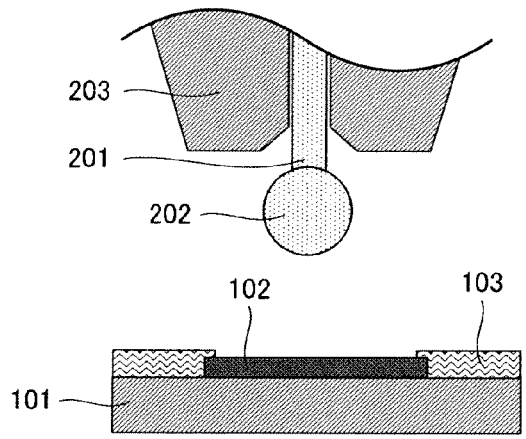
FIGS. 17A to 17C are sectional views showing the steps of forming a stud bump of the prior art.
Figure 17B:
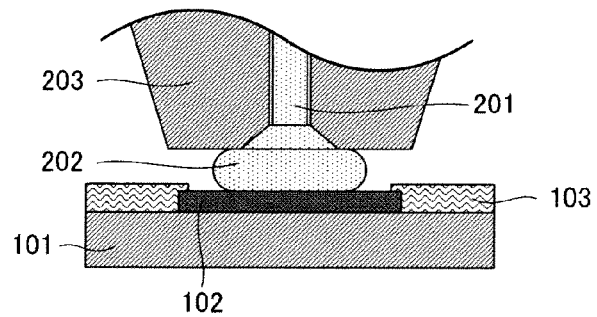
Figure 17C:
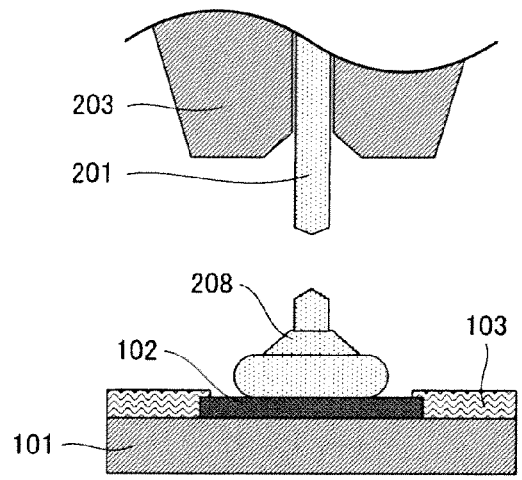
Figure 18A:
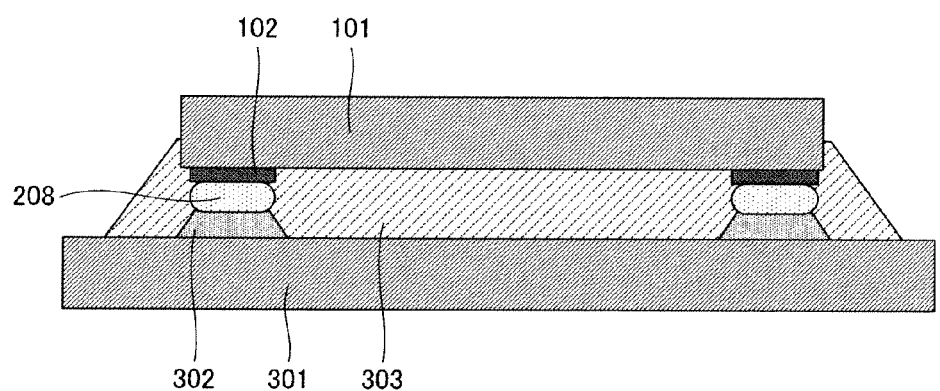
FIGS. 18A and 18B are sectional views showing the overall configuration and a connected portion of a mounting structure using the stub bumps of FIG. 17A to 17C.
Figure 18B:
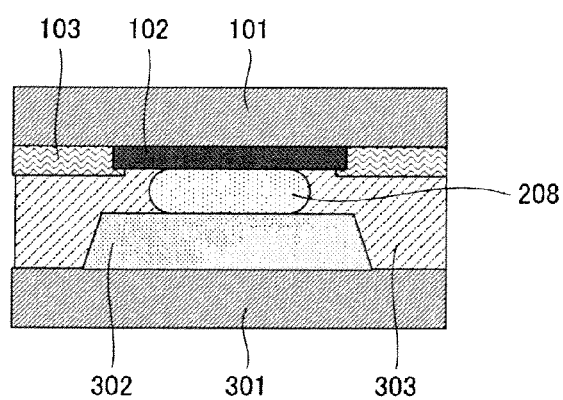
Figure 19A:
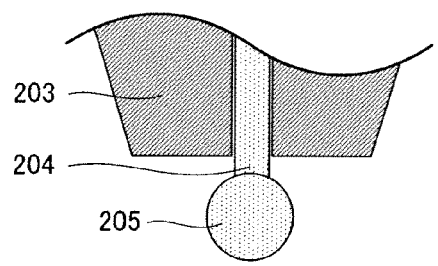
FIGS. 19A to 19F are sectional views showing the steps of the first half of the forming process of a two-layer bump of the prior art.
Figure 19B:
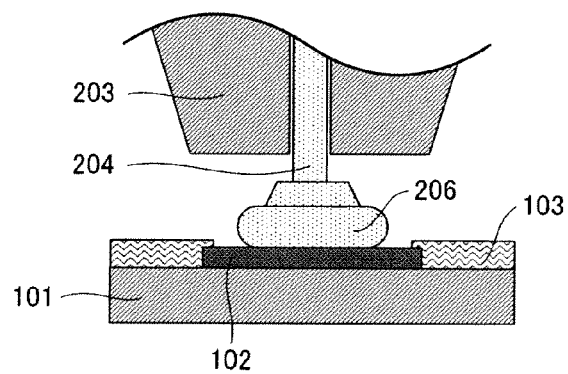
Figure 19C:
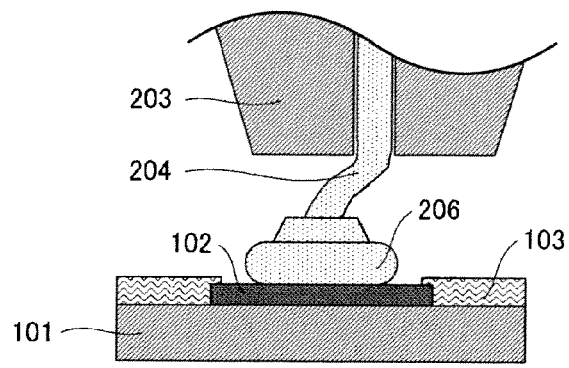
Figure 19D:
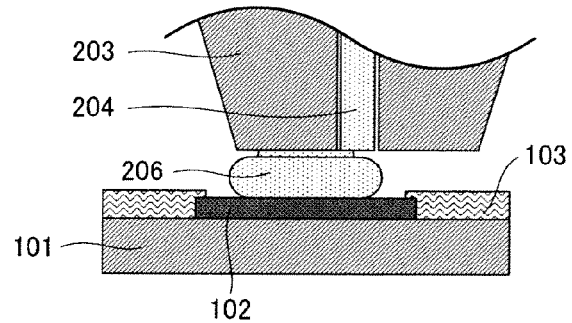
Figure 19E:
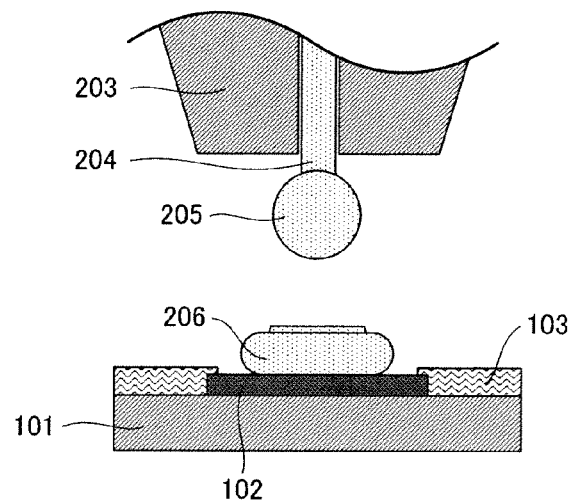
Figure 19F:
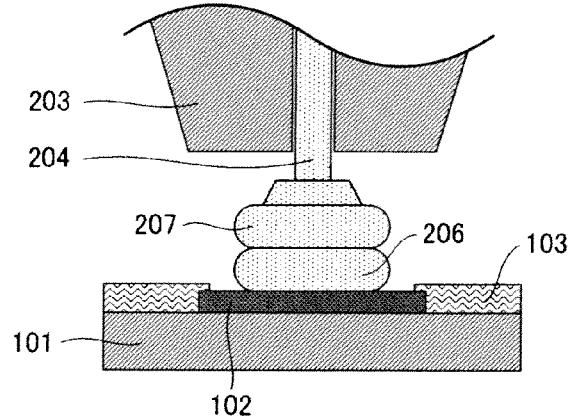
Figure 20A:
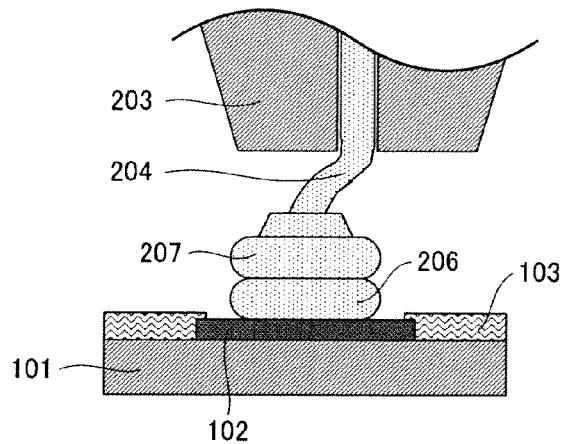
FIGS. 20A to 20C are sectional views showing the steps of the second half of the forming process of the two-layer bump of FIGS. 19A to 19F.
Figure 20B:
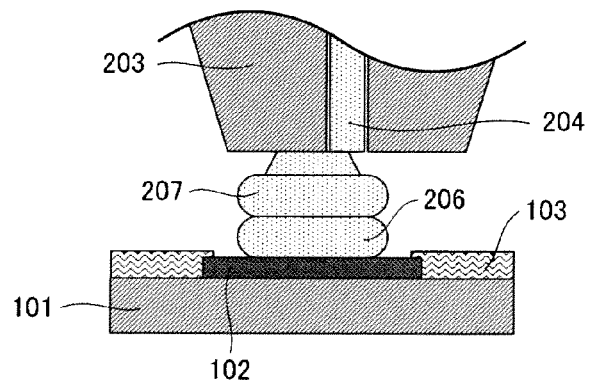
Figure 20C:
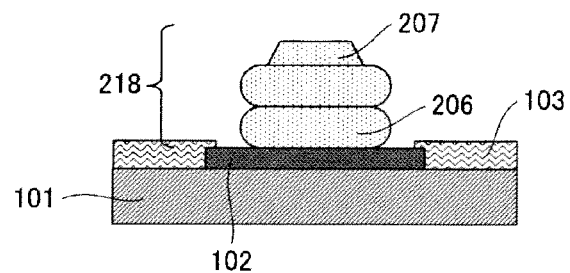
Figure 21:
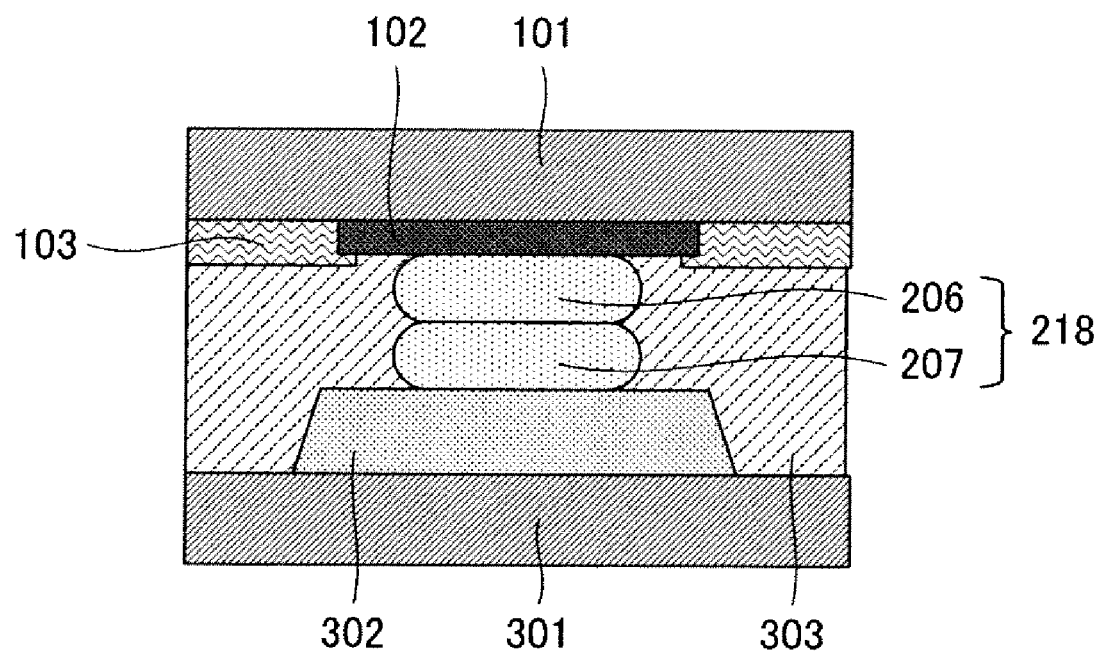
FIG. 21 shows a connected portion of the mounting structure using the two-layer bump shown in FIGS. 19A to 19F and FIGS. 20A to 20C.

FIGS. 5A and 5B are enlarged views of the joint of the semiconductor element 101 and the circuit board electrode 302. The second bump 210 in the two-layer bump 213 is connected to the circuit board electrode 302 and the connection area is larger than the connection area of the bump of the prior art (see FIGS. 17 and 20) and the circuit board electrode 302. The axis of the first bump 209 and the axis of the second bump 210 are not aligned with each other.

As has been discussed with FIG. 2, when the two-layer bump 213 is formed on the semiconductor element 101, the first bump 209 is disposed in the electrode surface of the electrode 102 of the semiconductor element 101 and the base 212 of the second bump 210 is larger in diameter than the first bump 209.

The relationship of dimensions is not changed even after the deformation of the two-layer bump 213. The first bump 209 is disposed in the electrode surface of the electrode 102 of the semiconductor element 101, and the second bump 210 is larger than the first bump 209 in diameter. Further, the second bump 210 is not smaller than the circuit board electrode 302 in diameter. The first bump is smaller in diameter than the circuit board electrode 302.

By suitably setting the dimensions of the two-layer bump 213 thus, even the small electrode 102 of the semiconductor element 101 can be stably joined to the larger circuit board electrode 302. The diameter of the first bump 209 is larger than at least a half of the diameter of the second bump 210 to always place the center of gravity of the second bump 210 above the first bump 209.

With the two-layer bump 213 configured thus, when the semiconductor element 101 is flip-chip mounted on the circuit board 301, the area of connection with the circuit board electrode 302 can be larger than the connection area of the bump of the prior art, thereby achieving reliability of connection with high quality.

The axis of the first bump and the axis of the second bump are not aligned with each other, to be specific, the second bumps are displaced to the axis of the semiconductor element 102, so that the semiconductor element 101 can be joined to the circuit board 301 at points close to the axis of the semiconductor element 101. Since distances from the axis of the semiconductor element 101 to the joints are reduced thus, it is possible to reduce a thermal stress generated in a thermal shock test and so on.

Figure 6:
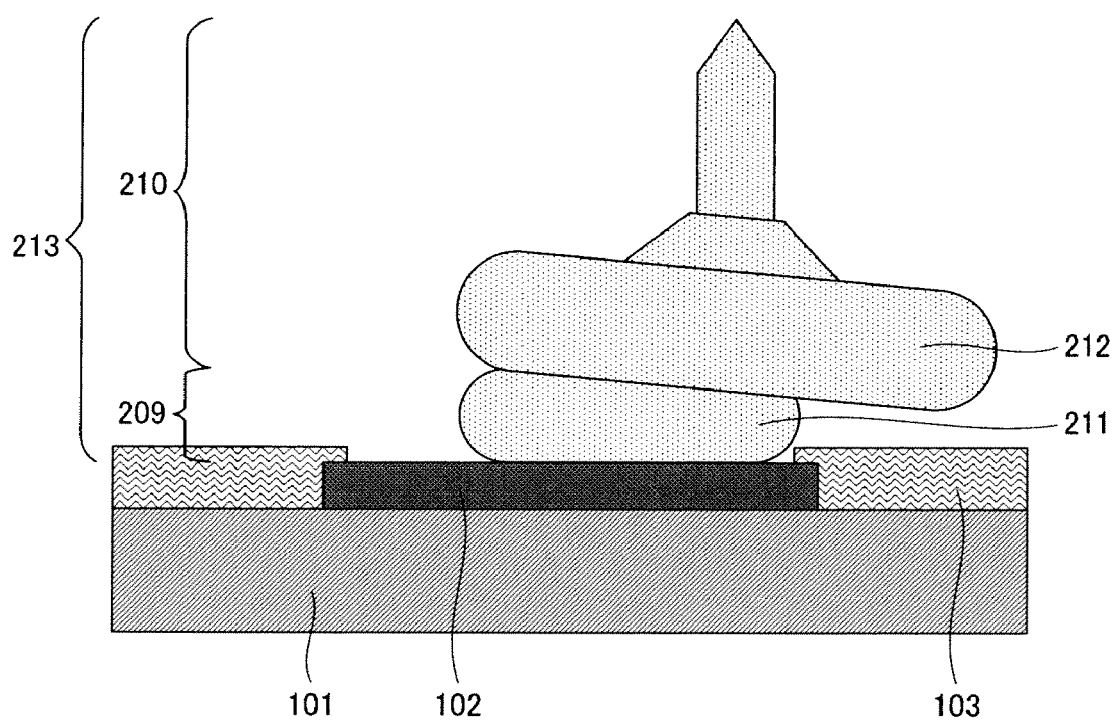
FIG. 6 is a sectional view showing another example of the electrode of the semiconductor element.

FIG. 6 shows the electrode of another semiconductor element 101. The semiconductor element 101 is different from FIG. 2 in that the two-layer bump 213 is displaced to one side of the electrode 102. The first bump 209 is displaced to one end of the electrode 102 (to the right end in FIG. 6) and the second bump 210 is further displaced in the same direction as the first bump 209. A part of the second bump 210 is placed outside the electrode 102.

For example, when the electrode 102 has an outside dimension of 54 μm and an array pitch of 120 μm, the first bump 209 is 45 μm in diameter and 10 μm in height and the base 212 of the second bump 210 is 85 μm in diameter and 25 μm in height. In this case, a displacement between the axis of the electrode 102 and the axis of the first bump 209 is 4.5 μm and a displacement between the axis of the first bump 209 and the axis of the second bump 210 is 20 μm.

Figure 7:
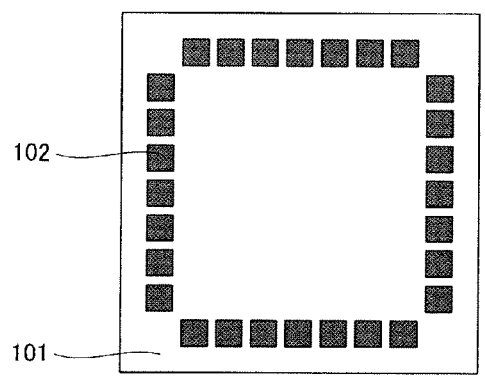
FIG. 7 is a plan view showing the layout of the plurality of electrodes on the semiconductor element.

FIG. 7 shows the layout of the plurality of electrodes 102 on the semiconductor element 101. The electrodes 102 are arranged on the outer periphery of one surface of the semiconductor element 101 along the four sides of the semiconductor element 101.

Figure 8:
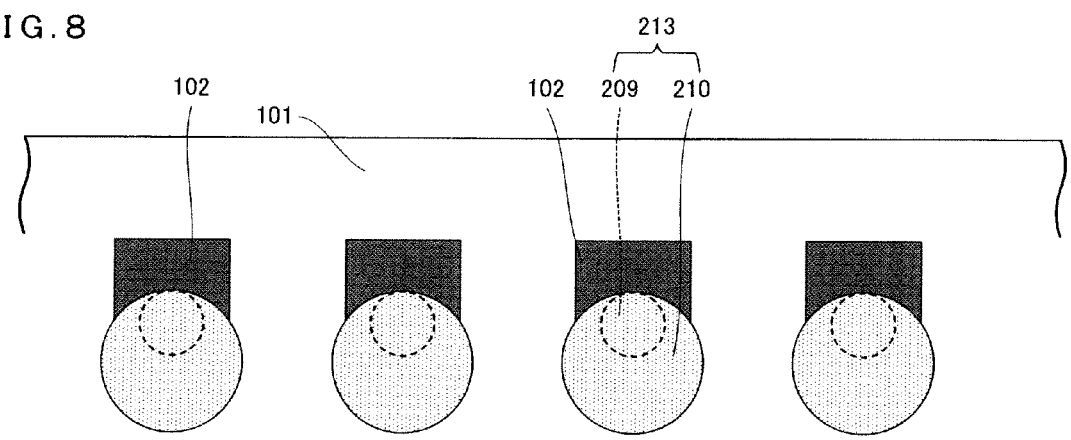
FIG. 8 is an enlarged plan view showing a layout example of the two-layer bumps formed on the electrodes of FIG. 7.

FIG. 8 shows a first example of the layout of the two-layer bumps 213 formed on the electrodes 102. The two-layer bumps 213 are all displaced to one side of the electrodes 102, that is, to the center of the semiconductor element 101 (in a direction orthogonal to one side of the semiconductor element 101).

In this layout, the semiconductor element 101 is joined to the circuit board 301 at points closer to the axis of the semiconductor element 102 than in a layout having the two-layer bumps 213 formed at the centers of the electrodes 102. It is generally known that the shorter the distance between the axis of the semiconductor element 101 and the joint, the lower the thermal stress generated in a thermal shock test and so on.

Thus according to the layout of the two-layer bumps 213, when the semiconductor element 101 is flip-chip mounted on the circuit board 301, the junction area of the two-layer bump 213 and the circuit board electrode 302 can be larger than the junction area of the bump formed according to the prior art. Further, it is possible to reduce a thermal stress generated in a thermal shock test and so on as compared with the two-layer bump 213 of FIG. 2, thereby further improving the reliability of connection.

As has been discussed with FIG. 2, the diameter of the first bump 209 is preferably larger than at least a half of the diameter of the second bump 210 to always place the center of gravity of the second bump 210 above the first bump 209.

Figure 9:
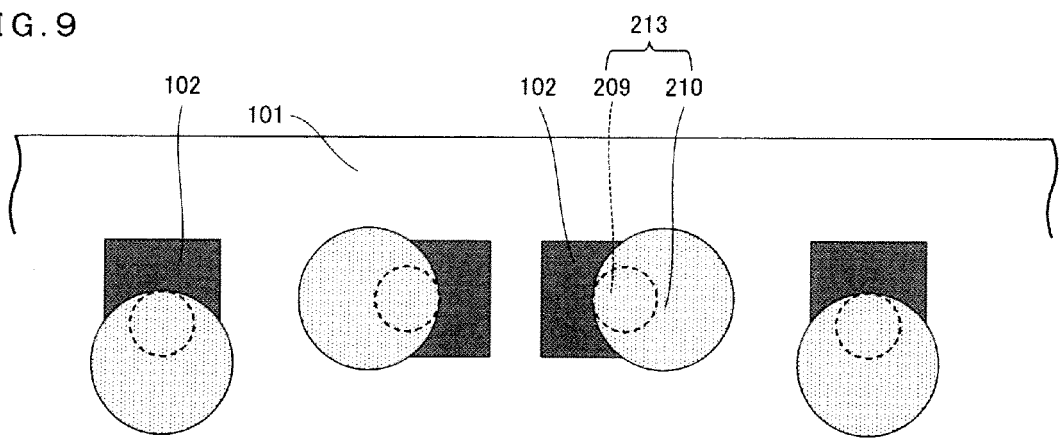
FIG. 9 is an enlarged plan view showing another layout example of the two-layer bumps formed on the electrodes of FIG. 7.

FIG. 9 shows a second example of the layout of the two-layer bumps 213 formed on the electrodes 102. Since distances between the electrodes 102 on the semiconductor element 101 are locally reduced, only the two-layer bumps 213 on the corresponding electrodes 102 are displaced in opposite directions, that is, along the sides of the semiconductor element 101. This layout can obtain the same effect as the layout of FIG. 8 and further prevent a short circuit during the formation of bumps and flip-chip mounting.

Figure 10:
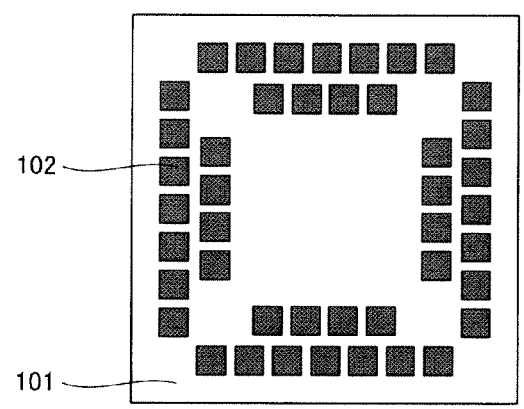
FIG. 10 is a plan view showing another layout of the plurality of electrodes on the semiconductor element.
Figure 11:
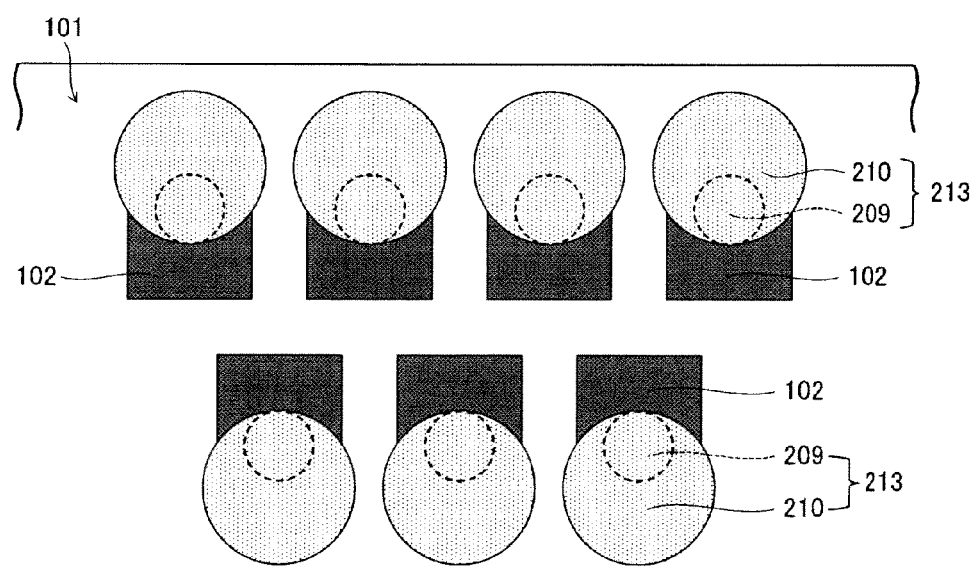
FIG. 11 is an enlarged plan view showing a layout example of the two-layer bumps formed on the electrodes of FIG. 10.
Figure 1:
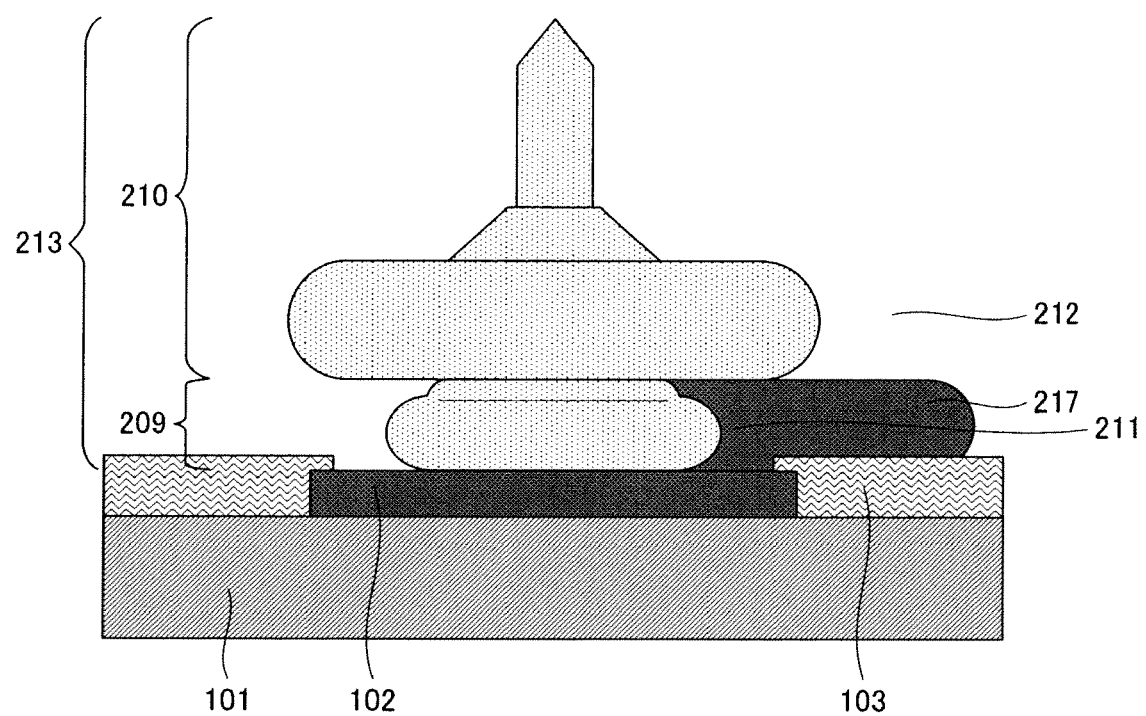

When the electrodes 102 are concentrically arranged in multiple rows on the semiconductor element 101 as shown in FIG. 10, the two-layer bumps 213 on the electrodes 102 of the inner row and the two-layer bumps 213 on the electrodes 102 of the outer row may be displaced in opposite directions as shown in FIG. 11, that is, in a direction departing from the side of the semiconductor element 101 and a direction approaching the side of the semiconductor element 101. Thus it is possible to prevent short circuits during the formation of bumps and flip-chip mounting.

FIG. 12 shows another example of the electrode of the semiconductor element 101. The semiconductor element 101 is different from FIG. 2 in that an elastic body 217 is formed in a gap between the electrode 102 of the semiconductor element 101 and the base 212 of the second bump 210 so as to cover one side of the first bump 209.

The elastic body 217 is formed by applying photosensitive or non-photosensitive polyimide or a material such as epoxy resin having heat resistance and insulating properties before the formation of the second bump 210. The outside dimension of the elastic body 217 is substantially equal to the outside dimension of the second bump 210.

With this configuration, in addition to the effect of the semiconductor element 101 in FIG. 2, the elastic body 217 in the gap under the second bump can reduce the concentration of a thermal stress on the connected portion of the first bump 209 and the second bump 210 in a reliability test on a flip-chip package, thereby further improving the reliability of connection.

Figure 13:
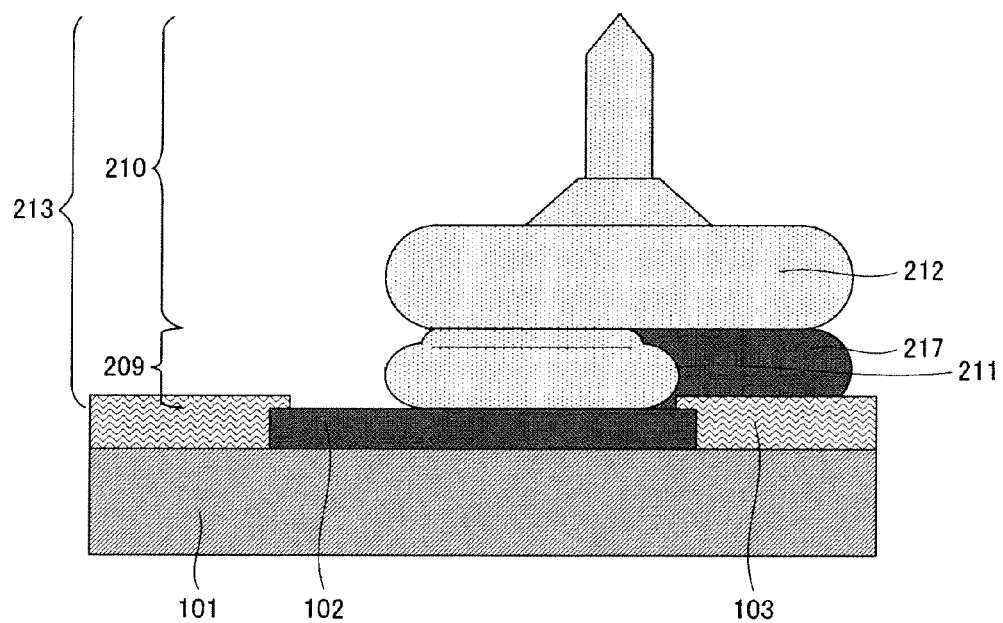
FIG. 13 is a sectional view showing still another example of the electrode of the semiconductor element.

As shown in FIG. 13, when the two-layer bump 213 is displaced to one side of the electrode 102, only a part of the first bump may be covered with the elastic body 217. The outside dimension of the elastic body 217 is substantially equal to the outside dimension of the second bump 210.

Figure 14:
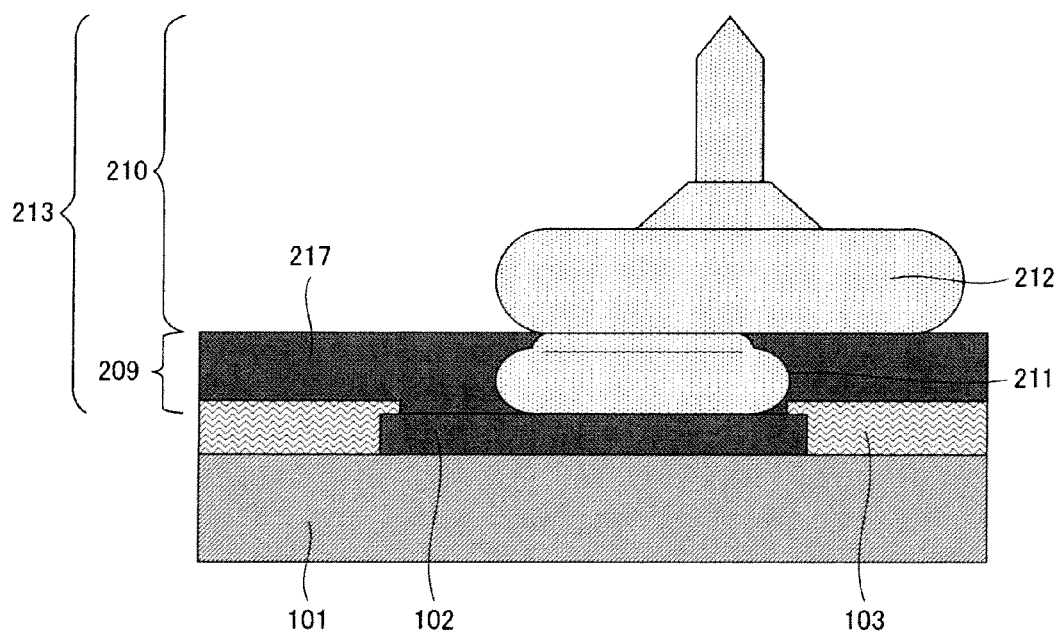
FIG. 14 is a sectional view showing still another example of the electrode of the semiconductor element.

As shown in FIG. 14, the elastic body 217 may be formed over the semiconductor element 101 or a wide area of the semiconductor element 101 so as to fill the gap formed by the electrode 102 of the semiconductor element 101 and the base 212 of the second bump 210.

Figure 15:
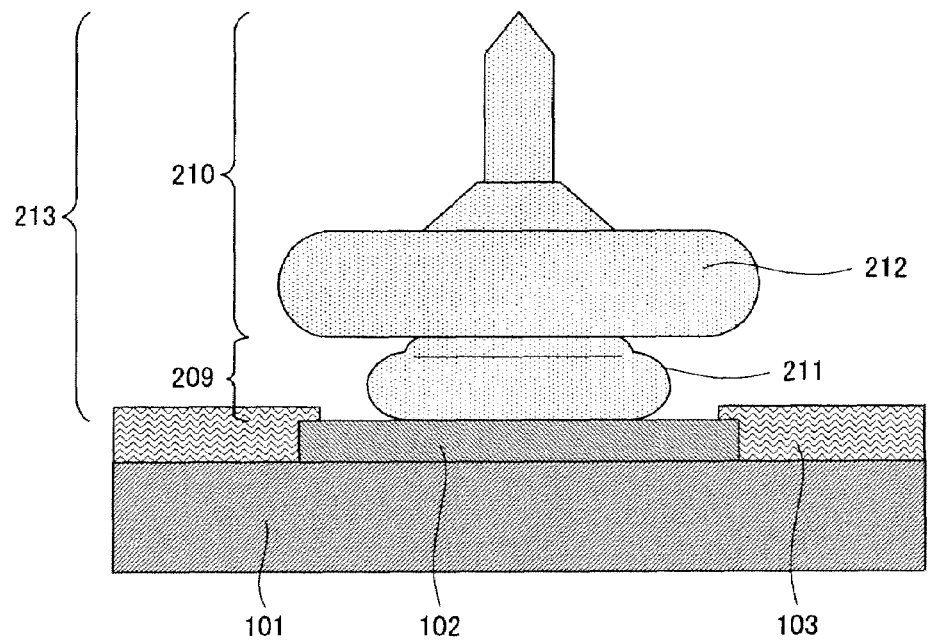
FIG. 15 is a sectional view showing still another example of the electrode of the semiconductor element.
Figure 16:
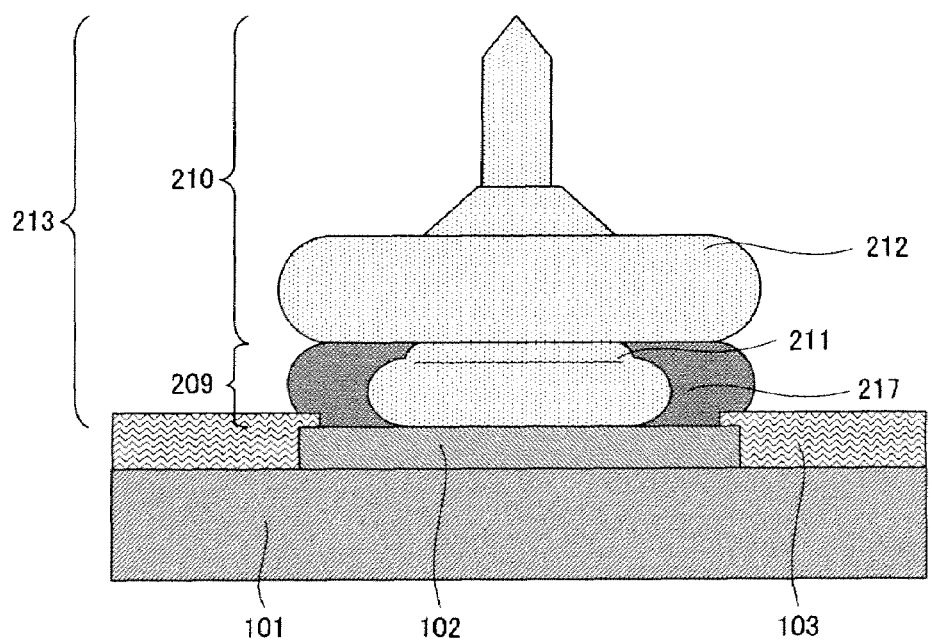
FIG. 16 is a sectional view showing still another example of the electrode of the semiconductor element.

In the foregoing explanation, the axis of the first bump 209 and the axis of the second bump 210 are not aligned with each other in the two-layer bump 213. As shown in FIGS. 15 and 16, it is needless to say that even the aligned axes can obtain a larger area of junction with the circuit board electrode 302 than the junction area of the bump of the prior art.

Further, in the foregoing explanation, the two-layer bumps 213 are formed on the semiconductor element 101. The two-layer bumps 213 may be formed on the circuit board 301 and joined to the semiconductor element 101. The two-layer bumps 213 are also applicable to electronic components other than the semiconductor element 101.

As has been discussed, according to the present invention, even a semiconductor element having small electrodes can obtain a sufficient contact area between a bump and a circuit board electrode, thereby achieving reliability of connection with high quality. Thus the present invention is applicable to a semiconductor element having smaller electrodes and is widely useful for size reduction of electronic equipment.

What is claimed is:

1. A mounting structure comprising:
a semiconductor element;
a circuit board having electrodes opposed to electrodes of the semiconductor element; and
conductive two-layer bumps each of which is made up of a first bump joined to the electrode of the semiconductor element and a second bump joined to the electrode of the circuit board,
wherein the first bump and the second bump are made of Au, the second bump is larger than the first bump, and an axis of the first bump and an axis of the second bump are not aligned with each other, the electrode of the circuit board is larger than the electrode of the semiconductor element, the size of the second bump is less than or equal to the size of the electrode of the circuit board, and the size of the first bump is less than or equal to the size of the electrode of the semiconductor element.

2. The mounting structure according to claim 1, wherein a virtual line passing through a center of gravity of the second bump passes through the first bump.

3. The mounting structure according to claim 1, wherein the first bump has a diameter not smaller than a half of a diameter of the second bump.

4. The mounting structure according to claim 2, wherein the first bump has a diameter not smaller than a half of a diameter of the second bump.

5. The mounting structure according to claim 1, wherein the semiconductor element has an elastic body formed along a side of the first bump, and the second bump is placed on the first bump and the elastic body.

6. The mounting structure according to claim 1, wherein the first bump is displaced to one end of the electrode of the semiconductor element.

7. The mounting structure according to claim 5, wherein the second bump is displaced closer to the end of the electrode of the semiconductor element than the first bump.

8. The mounting structure according to claim 1, further comprising a resin layer sealing the space between the semiconductor element and the circuit board and a periphery of the first bump and the second bump.

* * * * *